(12) United States Patent
Lazer

(10) Patent No.: US 10,824,394 B2
(45) Date of Patent: *Nov. 3, 2020

(54) CONCURRENT MULTI-BIT ADDER

(71) Applicant: GSI Technology Inc., Sunnyvale, CA (US)

(72) Inventor: Moshe Lazer, Binyamina (IL)

(73) Assignee: GSI Technology Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/554,730

(22) Filed: Aug. 29, 2019

(65) Prior Publication Data

US 2019/0384573 A1   Dec. 19, 2019

Related U.S. Application Data

(63) Continuation of application No. 15/690,301, filed on Aug. 30, 2017, now Pat. No. 10,402,165.

(51) Int. Cl.
| | | |
|---|---|---|
| *G06F 7/508* | (2006.01) | |
| *G11C 7/10* | (2006.01) | |
| *G11C 15/04* | (2006.01) | |
| *G06F 12/02* | (2006.01) | |

(52) U.S. Cl.
CPC ............ *G06F 7/508* (2013.01); *G11C 7/1006* (2013.01); *G11C 15/04* (2013.01); *G06F 12/0207* (2013.01); *G06F 2207/4804* (2013.01); *G06F 2207/5063* (2013.01)

(58) Field of Classification Search
None
See application file for complete search history.

(56) References Cited

U.S. PATENT DOCUMENTS

| | | | | |
|---|---|---|---|---|
| 9,455,020 | B2 * | 9/2016 | Manning | G11C 11/4091 |
| 9,747,961 | B2 * | 8/2017 | Tiwari | G06F 12/02 |
| 9,786,335 | B2 * | 10/2017 | Hush | G11C 11/4091 |
| 9,830,999 | B2 * | 11/2017 | Tiwari | G06F 9/30029 |

\* cited by examiner

*Primary Examiner* — Michael D. Yaary
(74) *Attorney, Agent, or Firm* — Heidi Brun Associates Ltd.

(57) ABSTRACT

A system includes an associative memory array and a concurrent adder. The memory array includes a plurality of sections, where each section includes cells arranged in rows and columns. The memory array stores bit j from a first multi-bit number and bit j from a second multi-bit number in a same column in section j. The concurrent adder performs, in parallel, multi-bit add operations of P pairs of multi-bit operands stored in columns of a memory array. Each pair of the P pairs is stored in a different column of the array and each add operation occurs in its associated different column.

12 Claims, 7 Drawing Sheets

SEC x

|  | Col 0 | Col 1 | Col 2 | ... | Col N |
|---|---|---|---|---|---|
| A |  |  |  |  |  |
| B |  |  |  |  |  |
| AorB |  |  |  |  |  |
| AandB |  |  |  |  |  |
| C0 |  |  |  |  |  |
| C1 |  |  |  |  |  |
| $C_{out}$ |  |  |  |  |  |
| Sum |  |  |  |  |  |
|  |  |  |  |  |  |
|  |  |  |  |  |  |
|  |  |  |  |  |  |

| # | Row | Action | Nibble1 | | | | Nibble0 | | | |
|---|---|---|---|---|---|---|---|---|---|---|
| | | | Sec 7 | Sec 6 | Sec 5 | Sec 4 | Sec 3 | Sec 2 | Sec 1 | Sec 0 |
| 1 | A | Write A | 0 | 1 | 1 | 1 | 0 | 1 | 1 | 0 |
| 2 | B | Write B | 1 | 1 | 1 | 0 | 1 | 0 | 1 | 1 |
| 3 | AorB | Set A + B | 1 | 1 | 1 | 1 | 1 | 1 | 1 | 1 |
| 4 | AandB | Set A * B | 0 | 1 | 1 | 0 | 0 | 0 | 1 | 0 |
| 5 | C0 | $C_{out} = A*B + C_{in} * (A+B)$ | | | | 0 | | | | 0 |
| 6 | C0 | $C_{out} = A*B + C_{in} * (A+B)$ | | | 1 | | | | 1 | |
| | C1 | | | | | 1 | | | | |
| 7 | C0 | $C_{out} = A*B + C_{in} * (A+B)$ | | 1 | | | | 1 | | |
| | C1 | | | | 1 | | | | | |
| 8 | C0 | $C_{out} = A*B + C_{in} * (A+B)$ | 1 | | | | 1 | | | |
| | C1 | | | 1 | | | | | | |
| 9 | C1 | $C_{out} = A*B + C_{in} * (A+B)$ | 1 | | | | | | | |
| | $C_{out}$ | Cout =C0 | | | | | 1 | 1 | 1 | 0 |
| 10 | $C_{out}$ | Cout= C1($C_{group-0}$) + C0(~$C_{group-0}$) | 1 | 1 | 1 | 1 | | | | |
| 11 | Sum | $S = A \oplus B \oplus C_{in}$ | 0 | 1 | 1 | 0 | 0 | 0 | 0 | 1 |

CONCURRENT MULTI-BIT ADDER

CROSS REFERENCE TO RELATED APPLICATIONS

This application is a continuation application of U.S. patent application Ser. No. 15/690,301, filed Aug. 30, 2017, which is incorporated herein by reference.

FIELD OF THE INVENTION

The present invention relates to associative memory generally and to a method for concurrent bit addition, in particular.

BACKGROUND OF THE INVENTION

In many computers and other kinds of processors, adders are used not only in arithmetic logic units, but also in other parts, where they are used to calculate addresses, table indices, increment and decrement operators, and similar operations.

FIG. 1 to which reference is now made illustrates a one-bit full adder 100 and a multi-bit ripple carry adder 120, all known in the art. One-bit full adder 100, receives three one-bit values as input, A, B, and Cin, and adds them. The output of one-bit full adder 100 is the calculated sum of the three input bits, S, and a bit carried out from the add operation, Cout.

Multi-bit ripple carry adder 120 may be used for adding N-bit variables A and B. Multi-bit ripple carry adder 120 may be constructed from N one-bit full adders 100. Each full adder 100 inputs a bit $A_i$ from variable A and a bit $B_i$ from variable B. Each full adder also inputs a carry in, $C_{in\text{-}i}$, which is the carry out of the previous adder, $C_{out\text{-}i\text{-}1}$.

FIG. 2, to which reference is now made, illustrates an exemplary, known in the art, four-bit ripple carry adder 120 used to add two 4-bit variables, A=1110 and B=0101, and comprises four one-bit full adders 100: 100a, 100b, 100c and 100d.

The input bits of full adder 100a are the least significant bits (LSB) of A, (e.g. 0), the LSB of B, (e.g. 1), and a carry in which is by definition 0 for the first full adder. Full adder 100a may perform the calculation (in this example 0+1+0). The output bits of full adder 100a are the result bit S with value of 1, and the carry out bit $C_{out}$ with value of 0. The $C_{out}$ of full adder 100a becomes the $C_{in}$ of full adder 100b. It may be appreciated that full adder 100b may start its computation only after the computation of full adder 100a has been completed and the same constraint applies to all full adders including 100c and 100d, except for the first. The last $C_{out}$, of the last full adder 100d, is referred to as the overflow of the computation.

The computation steps of this example are: In step 1, bit 0 (LSB) of both variables is added resulting in a bit $S_0$ and a carry out bit $C_{out\text{-}0}$. In step 2, bit 1 of both variables and the carry out of the previous step, $C_{out\text{-}0}$, are added, resulting in a bit $S_1$ and a carry out bit $C_{out\text{-}1}$. In step 3, bit 2 of both variables and the carry of the previous step, $C_{out\text{-}1}$, are added, resulting in a bit $S_2$ and a carry out bit $C_{out\text{-}2}$. Finally, in step 4, bit 3 of both variables and the carry of the previous step, $C_{out\text{-}2}$, are added, resulting in a bit $S_3$ and a carry out bit $C_{out\text{-}3}$. The result of the add operation is all bits S from all steps and the last carry out, which is the overflow if its value is 1.

It may be appreciated that a computation step may start only when all its input values are known, i.e. $A_i$, $B_i$ and $C_{in\text{-}i}$.

$A_i$ and $B_i$ are known in advance (bits from the input numbers A and B). The first $C_{in}$ is 0 (this is the first step, there is no previous step, thus there is no value to carry into this step). The value of $C_{in}$ in each step (except for the first one) is known only after the computation of the previous step is completed, as it is the $C_{out}$ of that former step.

It may be appreciated that the ripple carry adder can get very slow when adding large multi bit values. The entire ripple carry add computation is serial and its complexity is O(N), which is a disadvantage.

SUMMARY OF THE PRESENT INVENTION

There is provided, in accordance with a preferred embodiment of the present invention, a method for an associative memory device. The method includes in parallel, performing multi-bit add operations of P pairs of multi-bit operands stored in columns of a memory array. Each pair of the P pairs is stored in a different column of the array and each add operation occurs in its associated different column.

Moreover, in accordance with a preferred embodiment of the present invention, the performing includes for each pair of multi-bit operands A and B, storing each pair of bits $A_j$ and $B_j$ in a separate section of each column and dividing bits stored in each of the columns to groups. The method also includes in parallel in each column, utilizing per-column Boolean operations on each pair of bits to provide first-predicted carry-out values and second-predicted carry-out values of each bit in the groups, given a prediction that a value of a carry-in of all the groups is a first value and a second value, respectively. The method also includes in parallel in each column, selecting one of the first-predicted carry-out and the second-predicted carry-out, according to the actual carry-out of a previous group, to provide a final carry-out.

Additionally, in accordance with a preferred embodiment of the present invention, a first group for the selecting is a group of least significant bits and a last group for the selecting is a group of most significant bits.

Furthermore, in accordance with a preferred embodiment of the present invention, a carry-in of a first group is either a zero or an input.

Still further, in accordance with a preferred embodiment of the present invention, the method also includes concurrently adding together each bit j of a first number of each of the pairs, each bit j of a second number of each of the pairs and each bit j-1 of the final carry-out, used as a carry-in to bits j, thereby to produce a sum of the two multi-bit numbers.

Additionally, in accordance with a preferred embodiment of the present invention, the utilizing includes concurrently calculating and storing results of a Boolean OR operation between each bit j of a first number of each of the pairs and each bit j of a second number of each of the pairs, concurrently calculating and storing results of a Boolean AND operation between each bit j of a first number of each of the pairs and each bit j of a second number of each of the pairs and concurrently using the results for the ripple caries.

There is provided, in accordance with a preferred embodiment of the present invention, a system which includes a non-destructive associative memory array and a concurrent adder. The memory array includes a plurality of sections, where each section includes cells arranged in rows and columns. The memory array stores bit j from a first multi-bit number and bit j from a second multi-bit number in a same column in section j. The concurrent adder performs, in parallel, multi-bit add operations of P pairs of multi-bit operands stored in columns of a memory array. Each pair of the P pairs is stored in a different column of the array and each add operation occurs in its associated different column.

Moreover, in accordance with a preferred embodiment of the present invention, the concurrent adder includes a predictor, a selector and a summer. The predictor generally concurrently predicts a plurality of carry out values in each of the sections and the selector selects one of the predicted carry out values for all bits. The summer generally concurrently, for all bits, calculates a sum of the multi-bit numbers using the selected carry-out values.

Additionally, in accordance with a preferred embodiment of the present invention, the bits of the multi-bit numbers are divided into a plurality of groups of bits.

Furthermore, in accordance with a preferred embodiment of the present invention, the predictor stores, in a C0 row of the memory array, carry-out values produced from a prediction that a value of a carry-in to each group is a first value and stores in a C1 row of the memory array, carry-out values produced from a prediction that a value of a carry-in to each group is a second value.

Still further, in accordance with a preferred embodiment of the present invention, the selector stores, in a Cout row of the memory array, for each group a carry-out value taken from one of: row C0 and row C1 according to the actual carry out of a previous group.

Additionally, in accordance with a preferred embodiment of the present invention, the summer stores in a sum row of the memory array a sum of bit j of the two multi-bit numbers and bit j−1 of the Cout value.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 5 is a schematic illustration of data stored in a section of an associative memory array, constructed and operative in accordance with a preferred embodiment of the present invention;

FIG. 6 is a schematic illustration of what is stored in the various rows of the memory array during the add operation performed by the concurrent adder of FIG. 3 to concurrently add two 8-bit operands according to a preferred embodiment of the present invention.

Figure 1:
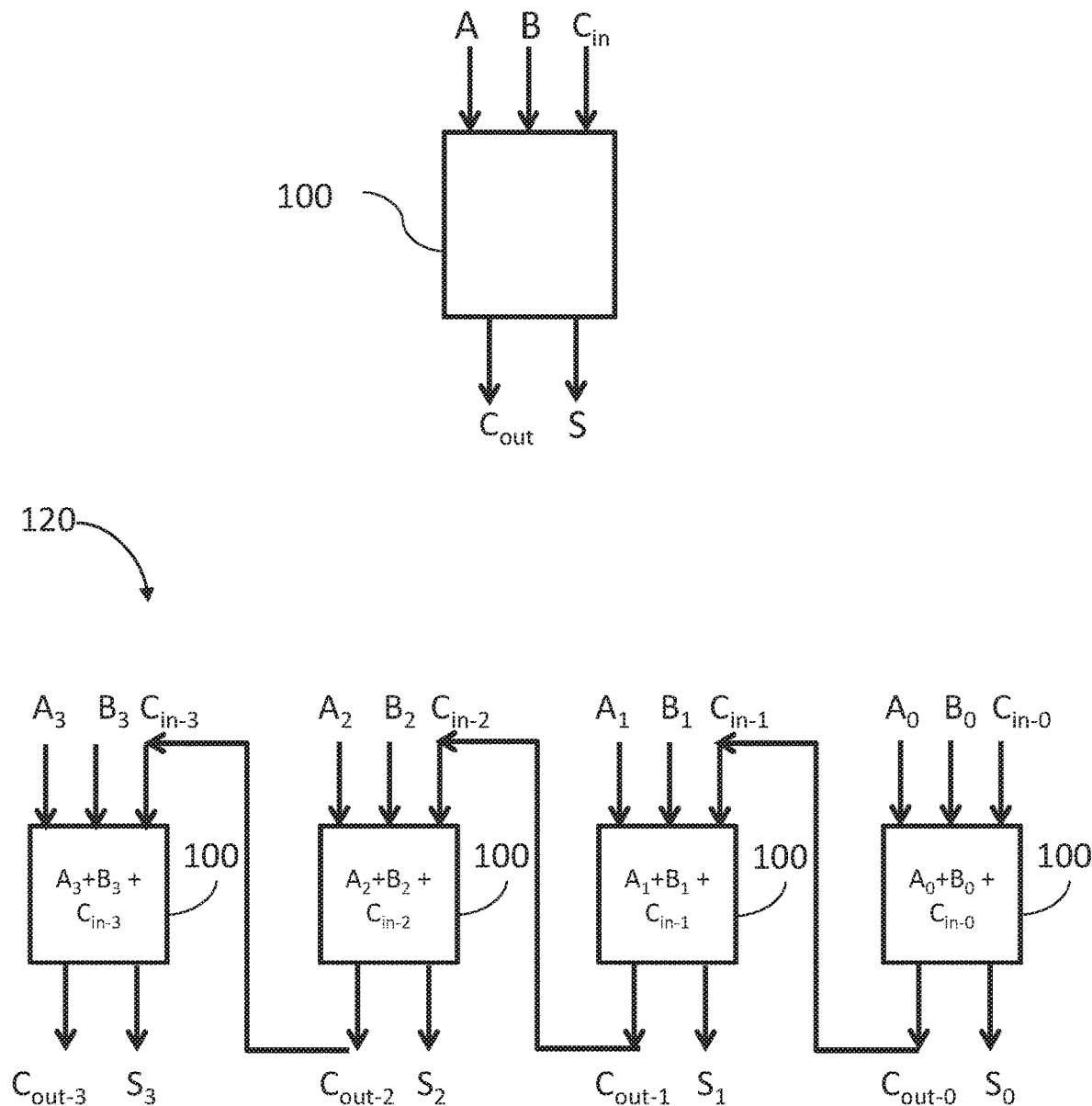
FIG. 1 is a schematic illustration of a one-bit full adder and a multi-bit ripple carry adder known in the art.
Figure 2:
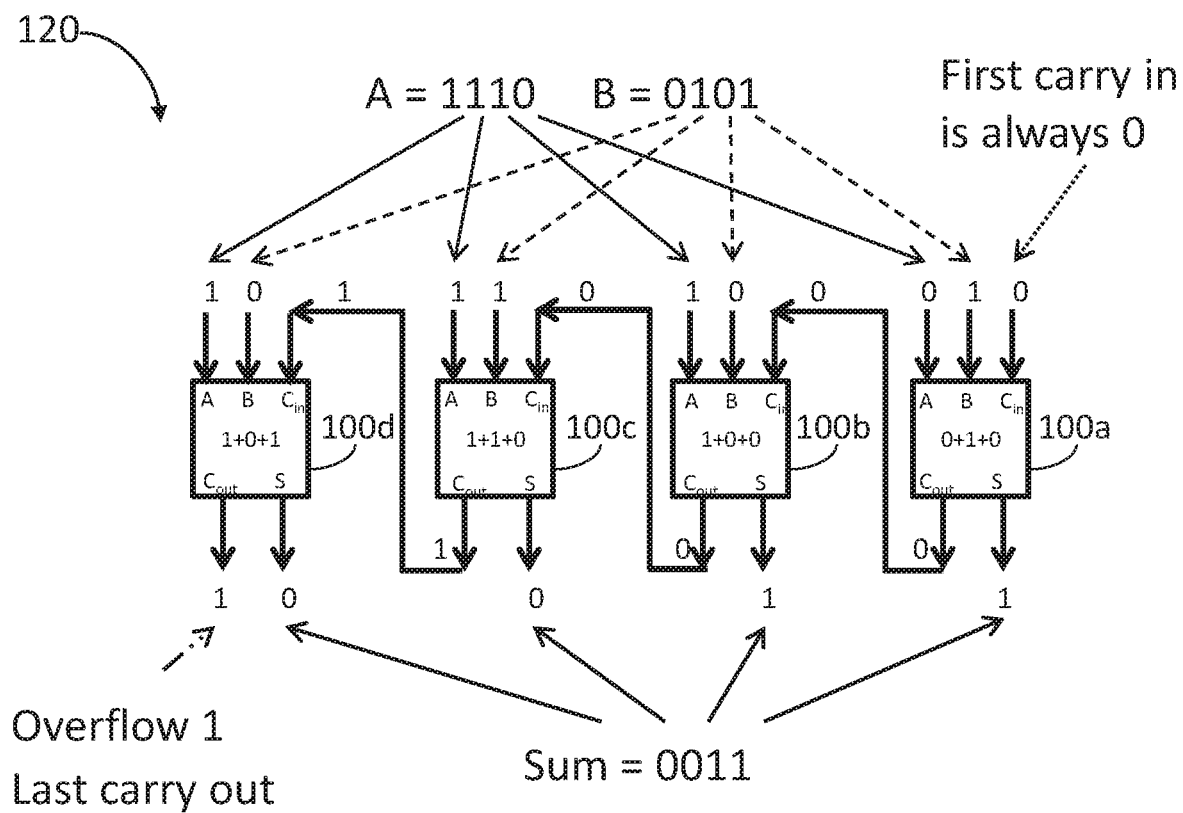
FIG. 2 is a schematic illustration of an exemplary, known in the art, four-bit ripple carry adder used to add two 4-bit variables.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

It is known in the art that the sum, S, and the carry out, $C_{out}$, of a one bit computation can be expressed by equations 1 and 2:

$$S = A \oplus B \oplus C_{in} \qquad \text{Equation 1}$$

$$C_{out} = A*B + C_{in}*(A+B) \qquad \text{Equation 2}$$

Where the symbol $\oplus$ indicates a Boolean XOR, the symbol $*$ indicates a Boolean AND and the symbol $+$ indicates a Boolean OR. The carry out signal may be calculated in advance by a procedure, known in the art, called Carry Look Ahead (CLA). The CLA calculation is based on the value of all previous input bits $A_i$ and $B_i$ (0<i<N) of variables A and B, and on the value of the first $C_{in}$. The computation of the CLA is expressed in equation 3.

$$C_{out\text{-}N} = A_N*B_N + A_{N-1}*B_{N-1}*(A_N+B_N) + A_{N-2}*B_{N-2}* \\ (A_{N-1}+B_{N-1})*(A_N+B_N) \ldots + C_{in}*(A_0+B_0)* \\ (A_1+B_1) \ldots (A_N+B_N) \qquad \text{Equation 3}$$

Using this technique, the bits of the variables may be split into groups (nibbles for example) and the carry of the group, referred herein as $C_{out\text{-}group}$, i.e. the carry from the last bit in the group, may be calculated without waiting for each bit computation to be completed. Using the CLA, the performance of a multi-bit adder may be improved (compared to the ripple carry); however, the CLA may only be implemented using specialized hardware, explicitly designed to calculate the expected carry out of a group using all the input bits of the group i.e. all the bits of variable A, all the bits of variable B and the $C_{in}$ of the group referred herein as $C_{in\text{-}group}$.

Applicant has realized that a similar carry propagation functionality, that improves the computation efficiency of a multi-bit adder compared to a ripple carry adder, may be provided by a multi-purpose associative memory replacing the specialized hardware, by performing a calculation using a prediction regarding the value of a carry in as described hereinbelow.

Multi-purpose associative memory devices are described in U.S. Pat. No. 8,238,173, (entitled "USING STORAGE CELLS TO PERFORM COMPUTATION") issued on Aug. 7, 2012; U.S. Patent Publication No. US 2015/0131383, (entitled "NON-VOLATILE IN-MEMORY COMPUTING DEVICE") published on May 14, 2015; U.S. Pat. No. 9,418,719 (entitled "IN-MEMORY COMPUTATIONAL DEVICE"), issued on Aug. 16, 2016 and U.S. Pat. No. 9,558,812 (entitled "SRAM MULTI-CELL OPERATIONS") issued on Jan. 31, 2017, all assigned to the common assignee of the present invention and incorporated herein by reference.

Applicant has further realized that the computation may be parallelized, using bit line processors, one per bit, as described in U.S. patent application Ser. No. 15/650,935 filed on Jul. 16, 2017 (entitled "IN-MEMORY COMPUTATIONAL DEVICE WITH BIT LINE PROCESSORS") and published on Nov. 2, 2017 as US 2017/0316829 assigned to the common assignee of the present invention and incorporated herein by reference.

Figure 3:
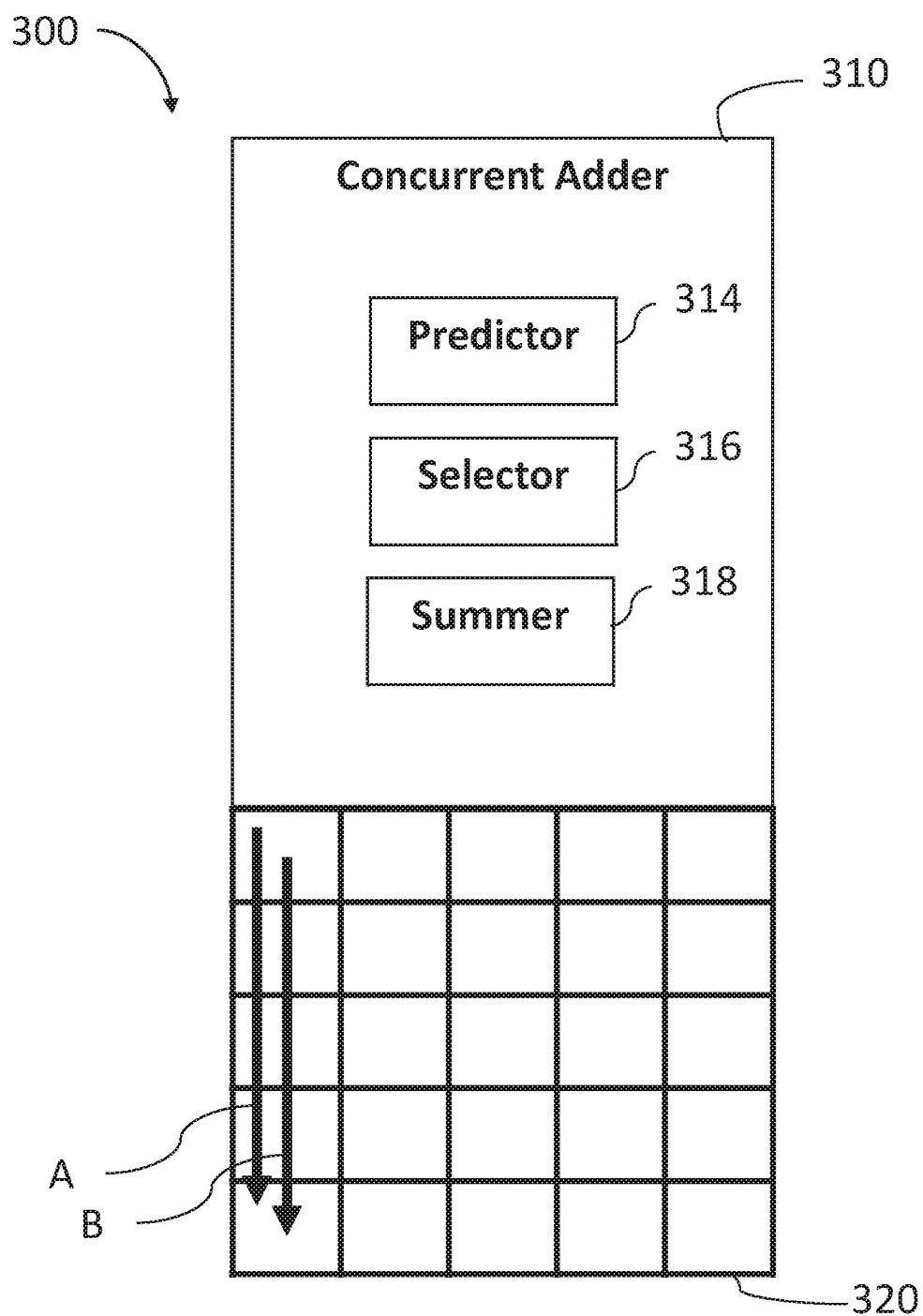
FIG. 3 is a schematic illustration of a multi-bit concurrent adder, constructed and operative in accordance with a preferred embodiment of the present invention.

FIG. 3, to which reference is now made, schematically illustrates a multi-bit concurrent adder 300, constructed and operative in accordance with a preferred embodiment of the present invention. Multi-bit concurrent adder 300 comprises a concurrent adder 310 and an associative memory array 320. Associative memory array 320 may store each pair of operands, A and B, in a column, and may also store intermediate and final results of the computation in the same column. Concurrent adder 310 comprises a predictor 314, a selector 316 and a summer 318, described in more detail hereinbelow.

Figure 4:
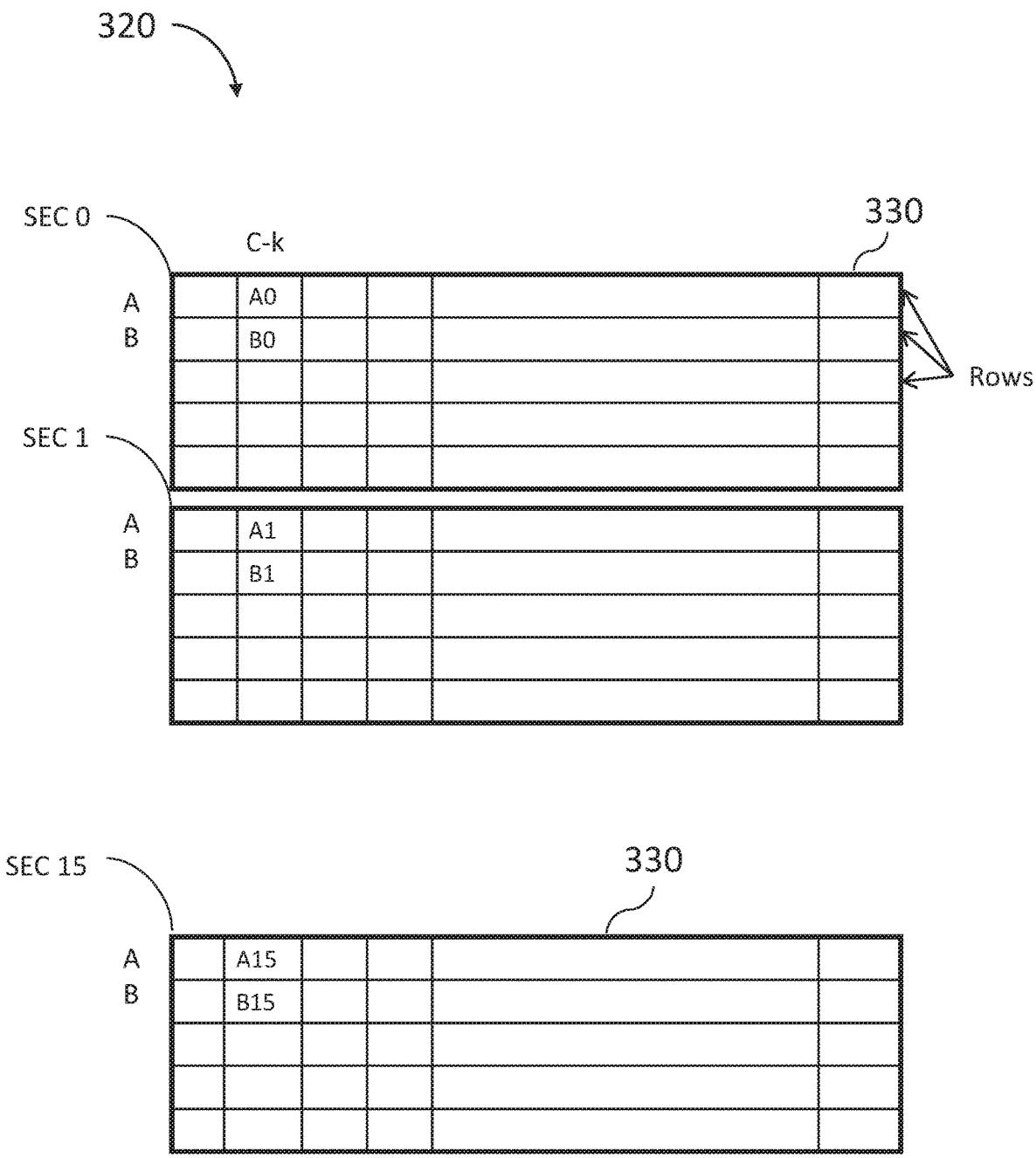
FIG. 4 is a schematic illustration of an associative memory array, constructed and operative in accordance with a preferred embodiment of the present invention.

FIG. 4, to which reference is now made, schematically illustrates associative memory array 320. Associative memory array 320 comprises a plurality of sections 330, each section 330 comprises rows and columns. Each section 330 may store a different bit of the operands A and B. Bits 0 of the operands may be stored in section 0, bits 1 may be stored in section 1 and so on until bit 15 may be stored in section 15. As can be seen, each bit j of both operands A and B may be stored in a different row of the same column k, of the same section j. In particular, bit A0 of operand A is stored in row A, column C-k of section 0, and bit B0 of operand B is stored in a different row, row R-B, in the same column col-k of the same section, section 0. The other bits of the operands A and B are similarly stored in additional sections 330 of associative memory array 320.

Concurrent adder 310 (of FIG. 3) may utilize additional rows of each section 330 to store intermediate values, predictions and final results as illustrated in FIG. 5, to which reference is now made. As already mentioned hereinabove, concurrent adder 310 may store, in a section x, a bit x from operand A in row A, and a bit x from operand B in row B. In addition, concurrent adder 310 may store the result of a Boolean OR performed on bits stored on rows A and B, in Row AorB. In row AandB concurrent adder 310 may store the result of a Boolean AND performed on bits stored on rows A and B. The values stored in both rows AorB and AandB may be used later for the computation of a carry out.

In C0, C1 and $C_{out}$, concurrent adder 310 may store a value related to the carry out. Predictor 314 may use row C0 to store a value of $C_{out}$, calculated using a prediction that the value of the carry in (to the group) will be 0. Predictor 314 may use row C1 to store a value of $C_{out}$, calculated using a prediction that the value of the carry in (to the group) will be 1. Selector 316 may select the actual value used by summer 318 for calculating the sum and may store it in row $C_{out}$ after the actual value of the carry in is known, when the calculation of the carry out of the previous group is completed. In row Sum, summer 318 may store the sum of bit x from operand B, bit x from operand A and the carry out from the previous computation, used as carry in.

As already mentioned before, all data relevant to a specific sum computation may be stored in a single column of each section, and each column may store different variables to concurrently perform multiple add operations, such that a computation regarding a specific pair of variables may be performed in col 0, while a completely unrelated computation on two other variables may be performed in a different column, such as col 1.

According to a preferred embodiment of the present invention, concurrent adder 310 (of FIG. 3) may relate to each variable having N bits as a variable having several groups of M bits each. For example, a 16-bit variable $X_{15}X_{14}X_{13}X_{12}X_{11}X_{10}X_9X_8X_7X_6X_5X_4X_3X_2X_1X_0$ may be divided into 4 groups of 4 bits $X_{15}X_{14}X_{13}X_{12}$, $X_{11}X_{10}X_9X_8$, $X_7X_6X_5X_4$ and $X_3X_2X_1X_0$. Using this approach, concurrent adder 310 may split each variable, A and B, into groups of size M and may perform the computation in the level of groups. It may be appreciated that the number of bits in the operands and the group size are not limited to specific sizes and the same steps and logic described in the current application may apply to operands having more or less bits, divided into a larger or smaller group size.

FIG. 6, to which reference is now made, schematically illustrates an example of the steps performed by concurrent adder 310 to concurrently add two 8-bit operands A and B in a table 600. It may be appreciated that the structure of table 600 only intends to facilitate the understanding of the procedure performed by multi-bit concurrent adder 300 (of FIG. 3) and does not apply to the hardware structure of associative memory array 320. For example, row 610 may contain all bits of number A written in step #1, each bit stored in a different row, in a different section labeled with the same label A, as can also be understood from FIG. 4 and FIG. 5. In the example of table 600, A=01110110 and B=11101011. Table 600 illustrates the data stored in different rows of different sections of associative memory array 320. Table 600 provides the step number in column 620, the row in column 630, the action performed by concurrent adder 310 on different sections 330 in column 640. The value contained in each section, 7-0, is provided by columns 657-650 respectively.

Concurrent adder 310 may store each bit of variable A in a dedicated section 330. The LSB of variable A is stored in row A of section 0, the next bit is stored in row A in section 1 and so on until the MSB of variable A is stored in row A of section 7. Variable B is stored similarly in row B of sections 1 to 7. Variables A and B may be divided into two groups of 4 bits: nibble0 comprising sections 0, 1, 2 and 3 and nibble1, comprising sections 4, 5, 6, and 7. In step #1 concurrent adder 310 may write variable A to rows A. The first four bits, 0110 may be stored in nibble0 and the other bits, 0111 may be stored in nibble1. Similarly, in step #2, concurrent adder 310 may write the first group of bits of variable B, which are 1011, to nibble0 and the second group of variable B, which are 1110, to nibble1.

Concurrent adder 310 may then calculate the result of a Boolean OR in, step #3, and a Boolean AND, in step #4, between the bits of operands A and B in each section as defined in equations 4 and 5.

$$AorB = A_i + B_i \qquad \text{Equation 4}$$

$$AandB = A_i * B_i \qquad \text{Equation 5}$$

Concurrent adder 310 may store the results of equations 4 and 5 in rows AorB and AandB, respectively. It may be appreciated that concurrent adder 310 may concurrently perform the calculation of each of the steps on all sections, i.e. equation 4 is calculated in a single step on all sections storing bits of operands A and B. In addition, equation 4 may be concurrently performed on all columns of associative memory array 320.

After calculating and storing values in rows AorB and AandB, concurrent adder 310 may calculate the carry out inside all groups in parallel, using the standard ripple carry formula of equation 6.

$$C_{out} = A*B + C_{in}*(A+B) = AandB + (C_{in}*AorB) \qquad \text{Equation 6}$$

The ripple carry inside a group may take M steps for a group of size M.

Since the carry in of all groups, except for the first one, is not known in advance, the ripple carry may be calculated inside each group twice. Predictor 314 may perform the first calculation under the prediction that the input carry of the group is 0 ($C_{group-in}=0$) and the second calculation under the prediction that the input carry of the group is 1 ($C_{group-in}=1$). Predictor 314 may store the calculated carry outs in dedicated rows in each section. Predictor 314 may store the carry value calculated assuming $C_{group-in}=0$ in row C0 and the carry value calculated assuming $C_{group-in}=1$ in row C1.

The standard ripple carry of equation 6 may be performed assuming $C_{group-in}=0$ in step 5 on the first section of each group, in step 6 on the second section of each group, in step 7 on the third section of each group and in step 8 on the fourth section of each group.

The standard ripple carry of equation 6 may be performed assuming $C_{group-in}=1$ in step 6 on the first section of each group, in step 7 on the second section of each group, in step 8 on the third section of each group and in step 9 on the fourth section of each group.

Thus, the two ripple carry operations may be performed in merely M+1 steps as concurrent adder 310 may start the calculation under the assumption of $C_{group-in}=1$, immediately after calculating the carry out of the first bit of the group using $C_{group-in}=0$ as the bits may be stored in different sections and a calculation may be done concurrently on any number of sections.

After the standard ripple carry is completed inside the groups, and rows C0 and C1 store values for all the bits of the group, concurrent adder 310 may perform a ripple carry between groups.

The $C_{group-in}$ of the first group may be zero, if there is no carry in from a previous computation, and may be the carry out of a previous computation if the current computation is a step in a multi-step process, such as adding a 64 bit number using 4 rounds of concurrent adding of 16 bit numbers. Selector 316 may write, in step 9, the values of the correct row of the first nibble to row $C_{out}$ according to the actual value of the $C_{in}$ of the first group. Since the actual value of the $C_{group-in}$ is known only once the carry out of the last bit of the previous group is calculated, selector 312 may select the relevant values of the carry bits for the group, i.e. from row C0 or row C1, after the $C_{group-out}$ of the previous group is known. In the example, the $C_{group-out}$ of the first group (the value stored in row C0 of section 3) is 1 and selector 316 may select row C1 of the second group as the actual values of the carry bits of nibble1. Selector 316 may then write the values of row C1 of the sections of nibble1 (sections 4, 5, 6 and 7) to row $C_{out}$ of the relevant sections in step 10.

In a preferred embodiment of the present invention, selector 316 may choose the value for $C_{out}$ of each group using equation 7.

$$Cout=(C1*C_{prev-group-out})+(C0*(NOT(C_{prev-group-out}))) \quad \text{Equation 7}$$

The $C_{group-out}$ of the first group is provided after M steps of a standard ripple carry adder (4 steps for a nibble as in the example of FIG. 6). The $C_{group-out}$ of the next groups is provided after M+1 steps of a standard ripple carry adder, as it is calculated for both $C_{group-in}=0$ and $C_{group-in}=1$ that can start after the first bit of the group is calculated using $C_{group-in}=0$.

Once all values of the carry are, known in all sections of all groups, summer 318 may concurrently compute, in step 11, the sum of all bits in all sections using equation 8.

$$S=A \oplus B \oplus C_{in} \quad \text{Equation 8}$$

where $C_{in}$ is the $C_{out}$ of the previous section.

Figure 7:
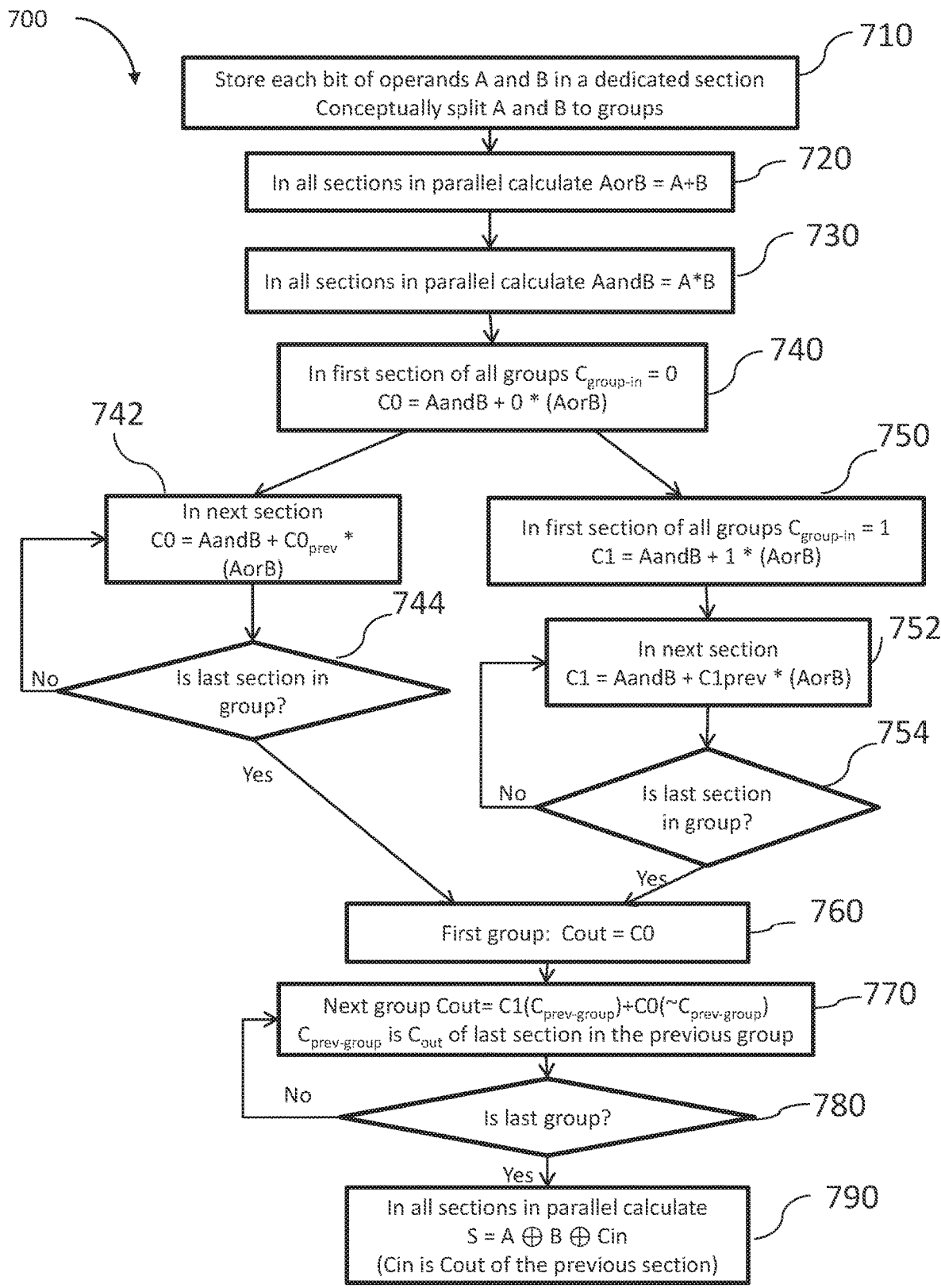
FIG. 7 is a flow chart illustration showing the operations performed by the concurrent adder of FIG. 3, according to a preferred embodiment of the present invention.

FIG. 7, to which reference is now made, is a flow chart 700 describing the steps that concurrent adder 310 may perform for adding operands A and B. In step 710, concurrent adder 310 may store operands A and B in sections 330 of memory array 320. In step 720, concurrent adder 310 may concurrently compute the Boolean OR between bits of operands A and B in all sections 330. In step 730, concurrent adder 310 may concurrently compute the Boolean AND between bits of operands A and B in all sections 330. In steps 740, 742 and 744, predictor 314 may perform a ripple carry inside all groups in parallel, assuming $C_{group-in}=0$, and in steps 750, 752 and 754, predictor 314 may perform a ripple carry inside all groups in parallel, assuming $C_{group-in}=1$. In step 760, selector 316 may compute the carry out of the first group using $C_{group-in}=0$. In steps 770 and 780, selector 316 may compute the carry out of the next groups until the carry out of the last group is computed and the correct carry row may be selected for the actual $C_{out}$ of the group. When the $C_{out}$ of the last groups is computed, summer 318 may compute the sum in step 790.

It may be appreciated by the person skilled in the art that the steps shown are not intended to be limiting and that the flow may be practiced with more or less steps, or with a different sequence of steps, or any combination thereof.

It may be appreciated that, for adding two 16 bit operands divided into four nibbles, concurrent adder 310 may perform the following procedures:

A. Calculate A+B (in parallel for all bits)
B. Calculate A*B (in parallel for all bits)
C. Calculate $C_{in}$ (in parallel for all groups) (total 8 steps)
  a. ripple carry inside nibble (total 5 steps)
    i. nibble 0: nibble ripple carry $C_{in}=0$ (4 steps)
    ii. nibbles 1-3: nibble ripple carry $C_{in}=0$ and $C_{in}=1$ (5 steps)
  b. ripple carry between nibbles (3 steps)
D. calculate sum: $S=A \oplus B \oplus Cin$ (in parallel for all bits)

It may be appreciated that concurrent adder 310 may perform the same steps for computing the sum of a 16 bit variable as in the example of the 8 bit numbers with 2 additional steps of "ripple carry between groups" for the third and fourth groups. It may also be appreciated that concurrent adder 310 may use a concurrent adder in two phases. In the first phase, the carry out of the least significant bits of the variables are calculated and the carry out of the last bit, or the overflow of the calculation, is an input carry in value used in the calculation of the most significant bits of the variables.

It may further be appreciated that the total carry ripple computation time may include a) the steps needed to perform a standard ripple carry inside a single group, equal to the number of bits M in the group (4 steps in a nibble in the example), b) the computation of a second standard ripple carry inside the group assuming another value of the $C_{in}$, that may take one additional step, as the computation for the first bit in a group may start immediately after the previous computation of that bit is completed, and c) number of groups minus 1 ripples between groups, as the $C_{out}$ of each group needs to ripple to the next group. For example, the computation complexity of ripple carry when adding two 16 bit numbers divided into four nibbles (the size of each nibble is 4), may be 4+1+3=8, while the computation complexity using a standard ripple carry for the same computation may be 16.

It may be appreciated that multi-bit concurrent adder 300 may concurrently perform multiple add operations on multiple pairs of operands stored in multiple columns of memory array 320, each pair stored in a different column. A complete add operation may be performed on a single column. Memory array 320 may comprise P columns and multi-bit concurrent adder 300 may concurrently operate on all columns, thereby performing P multi-bit add operations at the time.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A method for an associative memory device, the method comprising:
    in parallel, performing multi-bit add operations of P pairs of multi-bit operands stored in columns of a memory array,
    wherein each pair of said P pairs is stored in a different column of said array and each add operation occurs in its associated different column.

2. The method of claim 1 wherein said performing comprises:
    for each pair of multi-bit operands A and B, storing each pair of bits $A_j$ and $B_j$ in a separate section of each column;
    dividing bits stored in each of said columns into groups;
    in parallel in each column, utilizing per-column Boolean operations on each said pair of bits to provide first-predicted carry-out values and second-predicted carry-out values of each bit in said groups, given a prediction that a value of a carry-in of all said groups is a first value and a second value, respectively; and
    in parallel in each column, selecting one of said first-predicted carry-out and said second-predicted carry-out, according to the actual carry-out of a previous group, to provide a final carry-out.

3. The method of claim 2 wherein a first group for said selecting is a group of least significant bits and a last group for said selecting is a group of most significant bits.

4. The method of claim 3 wherein a carry-in of a first group is one of: zero and an input.

5. The method of claim 2 also comprising:
    concurrently adding together each bit j of a first number of each of said pairs, each bit j of a second number of each of said pairs and each bit j−1 of said final carry-out, used as a carry-in to bits j, thereby to produce a sum of said two multi-bit numbers.

6. The method of claim 2 wherein said utilizing comprises:
    concurrently calculating and storing results of a Boolean OR operation between each bit j of a first number of each of said pairs and each bit j of a second number of each of said pairs;
    concurrently calculating and storing results of a Boolean AND operation between each bit j of a first number of each of said pairs and each bit j of a second number of each of said pairs; and
    concurrently using said results for said ripple caries.

7. A system comprising:
    a non-destructive associative memory array comprising a plurality of sections, each section comprising cells arranged in rows and columns, to store bit j from a first multi-bit number and bit j from a second multi-bit number in a same column in section j; and
    a concurrent adder to, in parallel, perform multi-bit add operations of P pairs of multi-bit operands stored in columns of a memory array,
    wherein each pair of said P pairs is stored in a different column of said array and each add operation occurs in its associated different column.

8. The system according to claim 7 and wherein said concurrent adder comprises:
    a predictor, operative in parallel on said columns in said memory array, to generally concurrently predict a plurality of carry out values in each of said sections, said predictor performing per-column Boolean operations on each said pair of bits;
    a selector, operative on said columns in said memory array, to select one of said predicted carry out values for all bits; and
    a summer, operative on said columns in said memory array, to generally concurrently, for all bits, calculate a sum of said multi-bit numbers using said selected carry-out values.

9. The system according to claim 7 and wherein said bits of said multi-bit numbers are divided into a plurality of groups of bits.

10. The system according to claim 8 said predictor to store in a C0 row of said memory array carry-out values produced from a prediction that a value of a carry-in to each said group is a first value and to store in a C1 row of said memory array carry-out values produced from a prediction that a value of a carry-in to each said group is a second value.

11. The system according to claim 10 wherein said selector to store in a Cout row of said memory array, for each group a carry-out value taken from one of: row C0 and row C1 according to the actual carry out of a previous group.

12. The system according to claim 11 wherein said summer to store in a sum row of said memory array a sum of bit j of said two multi-bit numbers and bit j−1 of said Cout value.

* * * * *